(12) United States Patent
Sieger

(10) Patent No.: US 9,705,446 B1
(45) Date of Patent: Jul. 11, 2017

(54) MODULAR MULTI-AXIAL ROTOR

(71) Applicant: Charles Martin Sieger, Miami, FL (US)

(72) Inventor: Charles Martin Sieger, Miami, FL (US)

( * ) Notice: Subject to any disclaimer, the term of this patent is extended or adjusted under 35 U.S.C. 154(b) by 0 days.

(21) Appl. No.: 15/172,700

(22) Filed: Jun. 3, 2016

Related U.S. Application Data

(63) Continuation-in-part of application No. 14/595,727, filed on Jan. 13, 2015, now Pat. No. 9,404,476, which
(Continued)

(51) Int. Cl.
*F03B 17/06* (2006.01)
*F03D 1/02* (2006.01)
(Continued)

(52) U.S. Cl.
CPC ............ *H02S 10/12* (2014.12); *F03B 17/061* (2013.01); *F03B 17/063* (2013.01); *F03D 1/02* (2013.01); *F03D 1/0608* (2013.01); *F03D 3/005* (2013.01); *F03D 3/02* (2013.01); *F03D 3/061* (2013.01); *F03D 5/005* (2013.01); *F03D 9/002* (2013.01);
(Continued)

(58) Field of Classification Search
CPC ........ F03D 1/02; F03D 1/0608; F03D 1/0625; F03D 1/0633; F03D 1/0641; F03D 1/065; F03D 1/0658; F03D 3/02; F03D 3/061; F03D 3/062; F03D 3/064; F03D 3/065; F03D 5/005; F03D 9/002; F03D 9/25; F03D 9/007; F03B 17/06; F03B 17/061; F03B 17/062; F03B 17/063; F03B 17/065; F05B 2210/16; F05B 2240/243; F05B 2250/20; F05B 2250/21; F05B 2250/22; F05B 2250/25; F05B 2220/708; Y02E 10/223; Y02E 10/28; Y02E 10/70; Y02E 10/72; Y02E 10/721; Y02E 10/74; H01L 31/046; H02S 10/12
USPC ........ 290/43, 44, 54, 55; 415/66, 71, 72, 73, 415/74, 75, 76, 905, 908; 416/120, 122, 416/123, 132 R, 132 B, 176, 177, 244 R
See application file for complete search history.

(56) References Cited

U.S. PATENT DOCUMENTS

| 1,371,836 A | 3/1921 | Antz |
| 4,165,468 A | 8/1979 | Fry et al. |

(Continued)

FOREIGN PATENT DOCUMENTS

| DE | 10212354 A1 | 10/2003 | |
| DE | EP 1626176 A2 * | 2/2006 | ........... F03D 3/0472 |

(Continued)

*Primary Examiner* — Gregory Anderson
*Assistant Examiner* — Christopher R Legendre
(74) *Attorney, Agent, or Firm* — Malloy & Malloy, P.L.

(57) ABSTRACT

A modular, electricity generating apparatus comprises an elongate, central member comprising a first end and a second end; at least one solar foil disposed about the central member in fluid interacting relation thereto; the solar foil comprising an outer surface having photovoltaic properties; the first end and the second end dimensioned and configured to be connected to a connecting node; and, the elongate central member at least partially comprised of an electrically conductive material and configured to conduct electricity from at least one of the connecting nodes to the other of the connecting nodes.

19 Claims, 10 Drawing Sheets

Related U.S. Application Data is a continuation-in-part of application No. 13/444,306, filed on Apr. 11, 2012, now Pat. No. 8,932,005.

(51) Int. Cl.

| | | |
|---|---|---|
| *F03D 1/06* | (2006.01) | |
| *F03D 3/00* | (2006.01) | |
| *F03D 3/02* | (2006.01) | |
| *F03D 3/06* | (2006.01) | |
| *F03D 5/00* | (2006.01) | |
| *F03D 9/00* | (2016.01) | |
| *H02S 10/12* | (2014.01) | |
| *H01L 31/046* | (2014.01) | |
| *H02S 20/30* | (2014.01) | |

(52) U.S. Cl.
CPC ........... *F03D 9/007* (2013.01); *H01L 31/046* (2014.12); *H02S 20/30* (2014.12); *F05B 2210/16* (2013.01); *F05B 2220/708* (2013.01); *F05B 2240/243* (2013.01); *F05B 2250/20* (2013.01); *F05B 2250/21* (2013.01); *F05B 2250/22* (2013.01); *F05B 2250/25* (2013.01); *Y02E 10/223* (2013.01); *Y02E 10/721* (2013.01)

(56) References Cited

U.S. PATENT DOCUMENTS

| | | |
|---|---|---|
| 4,245,958 A | 1/1981 | Ewers |
| 4,500,259 A | 2/1985 | Schumacher |
| 4,708,592 A | 11/1987 | Krolick et al. |
| 4,717,832 A | 1/1988 | Harris |
| 5,313,103 A | 5/1994 | Hickey |
| 5,520,505 A | 5/1996 | Weisbrich |
| 5,642,984 A | 7/1997 | Gorlov |
| 6,247,897 B1 | 6/2001 | Patel |
| 7,364,406 B2 | 4/2008 | Kinkaid |
| 7,633,174 B1 | 12/2009 | Feiler |
| 8,932,005 B2 | 1/2015 | Sieger |
| 9,404,476 B2 | 8/2016 | Sieger |
| 2002/0078687 A1 | 6/2002 | Donnelly |
| 2008/0273974 A1 | 11/2008 | Becker |
| 2009/0086465 A1* | 4/2009 | St-Germain ............ F03D 3/005 362/89 |
| 2009/0214339 A1 | 8/2009 | Poleacov et al. |
| 2009/0295293 A1* | 12/2009 | Lawton .................. F03D 3/065 315/76 |
| 2010/0181780 A1 | 7/2010 | Gillett |
| 2011/0049905 A1 | 3/2011 | Khoshnevis |
| 2012/0076656 A1 | 3/2012 | Abass |
| 2013/0147199 A1 | 6/2013 | Zambrano et al. |
| 2013/0343891 A1 | 12/2013 | Rajakaruna et al. |

FOREIGN PATENT DOCUMENTS

| | | | |
|---|---|---|---|
| FR | WO 2009071835 A1 * | 6/2009 | ............ F03D 9/002 |
| JP | 2013174208 A | 9/2013 | |

\* cited by examiner

MODULAR MULTI-AXIAL ROTOR

CLAIM OF PRIORITY

This application is a continuation-in-part of U.S. application Ser. No. 14/595,727 filed on Jan. 13, 2015 which is a continuation-in-part of U.S. application Ser. No. 13/444,306 filed on Apr. 11, 2012, which matured into U.S. Pat. No. 8,932,005 on Jan. 13, 2015, the disclosure of each is explicitly incorporated by reference herein, in their entireties.

BACKGROUND OF THE INVENTION

Field of the Invention

The present invention is directed toward electricity generating apparatuses, and particularly, those apparatus that are modular in nature and may be interconnected to form electricity generating assemblies for enhanced electricity production. Additionally, the present application is directed to such modular electricity generating apparatuses as additionally incorporate photovoltaic materials and capabilities to further enhance electricity production.

Description of the Related Art

Electricity generating devices which are powered by wind or passing fluid and which operate via vertical rotor are known within the art. For example a savonius-type rotor generally includes a rotor blade disposed in parallel alignment with the central rotor. Additionally, such rotors only work in a vertical or horizontal position whereby they are typically used as singular structures, with no modular or constructive features. Additionally, efficiency is significantly decreased if the passing fluid is not substantially perpendicular to the foil of such a savonius-type rotor. As such, mounting a savonius-type rotor horizontally or on an incline can lead to significant declines in efficiency of the apparatus.

Additionally, photovoltaic materials and their use in solar panels are known in the art. However, solar panels should be mounted so as to maximize exposure to light. Fixedly mounted solar panels are generally arranged to capture a predetermined range of sunlight, given the solar panel's location on the Earth, but are far from optimal. Solar trackers may be utilized in order to continually reorient the solar panel, but can be expensive and complicated devices.

The present invention addresses these problems, and others known in the art, by providing an electricity generating apparatus, which is both modular and scalable in nature and configured to produce electricity regardless of the wind or fluid direction relative to its central axis and regardless of its orientation relative to the sun. Additionally, the present invention may be utilized as a structural assembly component, thereby providing auxiliary sources of electricity production in locations heretofore not possible, such as, within a truss of a bridge or a tower, supporting enclosed spaces, and the like. Lastly, the present invention is capable of incorporating photovoltaic materials, such as thin-film solar cells, and deploying them effectively without regard to the invention's location on the Earth.

SUMMARY OF THE INVENTION

One aspect of the present invention is an electricity generating apparatus. The apparatus is modular in nature, as well as scalable in dimension. The apparatus includes an elongate central member about which a foil is disposed. The foil may be configured to interact with a passing fluid such that a force is generated on the foil via the passage of the fluid. When the central member is rotationally mounted between two fixed points, the force generated by the passage of fluid may induce a rotation of the foil and/or central member about a central axis of the apparatus.

In at least one embodiment, the foil comprises at least one surface which is disposed helically about the central member. As such, the power generated by the foil is generally independent of the direction of fluid flow relative to the apparatus. This is because the helical configuration allows at least some portion of the surface area of the foil to always be presented to the fluid flow. In other embodiments, any number of a variety of foil configurations may be appropriately utilized.

Additional features of certain embodiments of the apparatus include integral electricity generating structure within the apparatus. By way of example, the central member may be comprised of a central stator disposed along the length of the central member. Additionally, a hollow shell may then be rotationally disposed about the central stator and the foil attached to the shell, either unitarily or otherwise. Such a configuration lends itself to the inclusion of the various structures and features of an electrical generator commonly known as a dynamo, alternator, or otherwise, with the central member forming the stator of such a generator and the hollow shell forming the rotor of such a generator.

Yet another feature of the present invention is that it is modular and may be constructed into assemblies. For example, a plurality of substantially identical apparatuses may be interconnected via a plurality of connecting nodes. A connecting node may, for example, include a collar, into which an end of the apparatus may be inserted for retention therein. Accordingly, a plurality of connecting nodes may be provided with a plurality of apparatus to construct a variety of configurations, such as pyramids, domes, towers, etc. which may be utilized in or as part of self-supporting, as well as external load-supporting, structures.

As an alternative embodiment, at least some of the electrical generator structuring may be disposed within the connecting node. By way of example one end of a central member may be rigidly connected to a rotor of an electric generator disposed within the connecting member. As such, when the central member rotates, due to the force of fluid passing the foil, the rotor of the electric generator will rotate accordingly. Alternatively, one end of the central member may form such a rotor and be inserted into receiving relation with a stator disposed inside the connecting node, thereby forming an alternative electric generator.

Additionally, in such assemblies as have been described heretofore, each of the connecting nodes and each of the apparatuses may contain electrical contacts which may be interconnected, such that the electricity generated by each apparatus of an assembly may be conducted through the entire assembly to a single receptacle point on the assembly, thereby reducing the need to electrically connect each apparatus individually with external electrical contacts.

Yet another feature of the present invention is the ability to form structural assemblies from the apparatus and connecting nodes. The apparatus and connecting nodes of the present invention lend themselves to being formed of a variety of materials, plastics, metals, etc. As such, the present invention may be formed of material with sufficient structural integrity so as to allow the assemblies of the present invention to bear weight, for example, structural steel and/or other metals or alloys. Composite materials are also suitable for such an application.

Accordingly, in certain embodiments, the apparatus may be formed into weight bearing assemblies, for example, triangular structures, and further assembled into towers, domes, pyramids, bridge structures, support members for enclosed spaces, and the like. As such, the assemblies of the present invention may be used to support external structures, for example, a roadway of a bridge or a roof which may be suspended from an assembly. Alternatively the present invention may be used to form towers such as, radio towers, water towers, etc.

In at least one embodiment of a structural assembly, the apparatus includes a rigid connection to each adjacent connecting node such that force may be transferred through adjacent apparatuses and connection nodes. In this sense, the apparatus of the structural assemblies may be stressed members when disposed in weight supporting relation to an external structure, such as, but not limited to, a bridge roadway, suspended roof of an enclosed structure, reservoir of a water tower, one or more satellite receivers and/or broadcast antennae, etc.

In yet further embodiments of the invention, the foil may include photovoltaic materials on an outwardly facing surface, or at least beneath a protective layer, such that the foils may be utilized as solar panels. It will be appreciated herein that the terms "outwardly facing surface" or "outer surface" can include any surface of the foil which faces or is exposed to the exterior of the foil. These terms are in contrast to an interior surface of the foil, such as in embodiments where the foil includes an at least partially hollow interior. Such a configuration can be termed a "solar foil." As such, the apparatus of the present invention can be configured to generate electricity from solar energy, kinetic fluid energy, or both. Additionally, the present invention presents a novel improvement over solar panel positioning systems as being more efficient than stationary, ground-based systems, and less complex and expensive than solar tracking systems.

The solar foil of the present invention can be configured similarly to previous embodiments, in that the solar foil can comprise at least one surface which is disposed helically about the central member. As such, at least some portion of the surface area of the foil is presented to the fluid flow such that the solar foil may rotate about the central member. When rotating, at least some portions of the solar foil will be presented in an optimal position, or at least a most optimal position available, relative to the sun. Therefore, the apparatus of the present invention may be installed without regard to the direction of the sun, or the relative placement of the apparatus on the surface of the earth, as the rotation of the solar foil effectively increases the incidence area of light upon the photovoltaic materials, relative to a stationary solar panel.

Additionally, the solar foil of the present embodiment may be combined with the integral electricity generating structure of previous embodiments in order to increase electricity production. Such an apparatus is capable of producing electrical power both from the photovoltaic effects of the outer surface of the solar foil, as well as from the induction caused by the rotation of the shell around the central stator, as described above. Additionally, the solar foil may be disposed in electrical communication with the integral electricity generating structure of previous embodiments in order to facilitate communication of electricity from the solar foil to at least one of the connecting nodes, such that electricity may be withdrawn from the apparatus and utilized. In certain embodiments a rotating electrical slip ring may be disposed between the shell and the stator of the central member in order to facilitate electrical communication between the solar foil and the connecting nodes.

In certain embodiments the solar foil may be comprised of thin-film solar cells, as they are known in the art, which provide thin layers of photovoltaic material on a light weight and/or flexible substrate. The solar foil may also comprise such additional structuring as would be appreciated by those of ordinary skill in the art such as, e.g, protective coatings, skeletal frameworks, etc.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE PREFERRED EMBODIMENT

Figure 1:
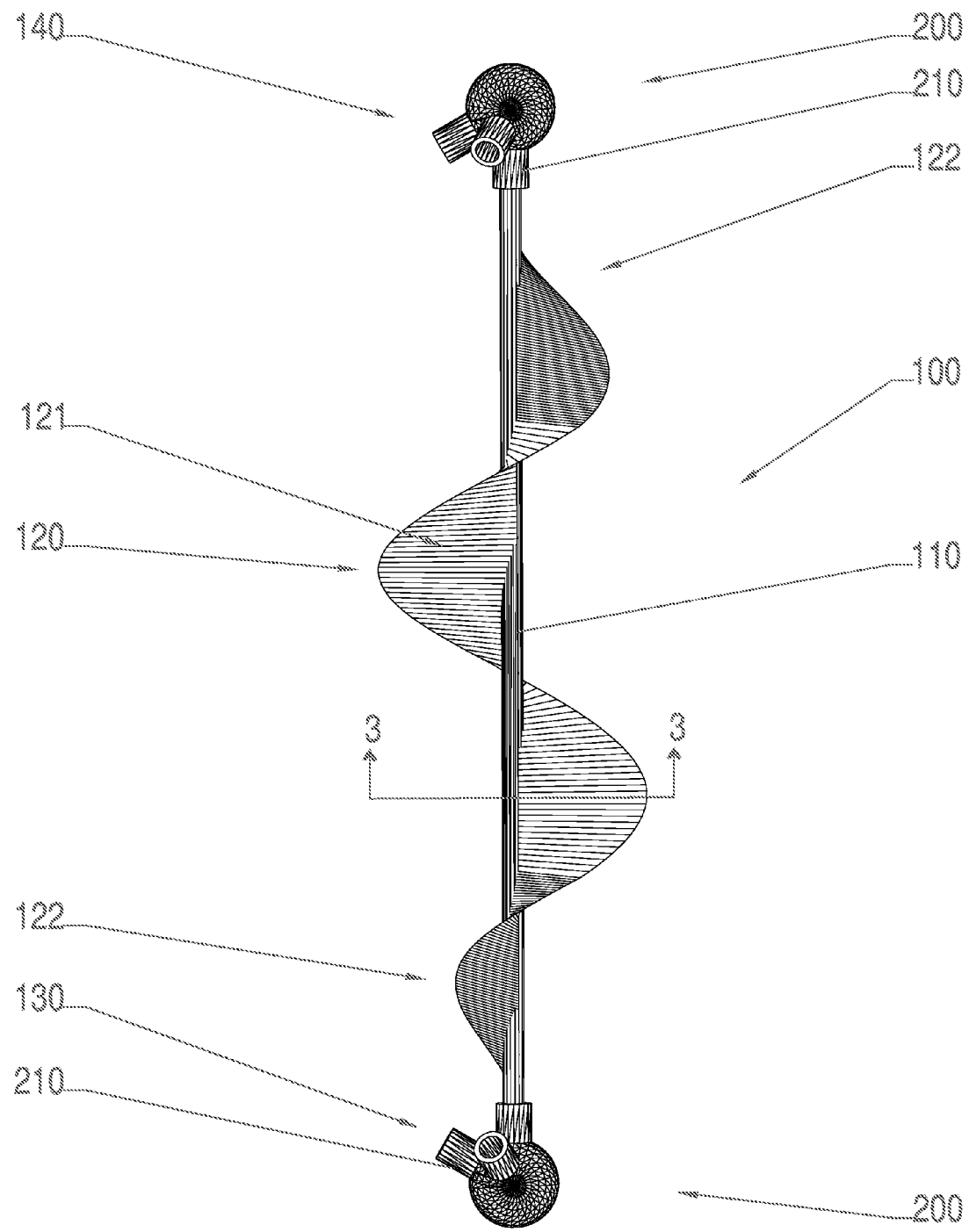
FIG. 1 is a side plan view of an electricity generating apparatus and connecting nodes according to one embodiment of the present invention.

FIG. 1 depicts an electricity generating apparatus 100 according to one embodiment of the present invention. The apparatus 100 as depicted includes an elongated central member 110. The central member 110 serves in part to provide a mounting point for the foil 120, as well as to interconnect the apparatus 100 between connecting nodes 200. Additionally, the central member 110 may serve as an axle about which the apparatus 100 may rotate. For example, the central member 110 may be disposed in rotatable relation to the connecting nodes 200.

The foil 120 of the present invention is an at least partially rigid structure connected to or disposed on or about the central member 110. The foil 120 serves to transmit force to the central member 110 via interaction with a fluid travelling past the foil 120. For purposes of the present invention any of a variety of foil shapes or configurations may suffice, such as a traditional airfoil or other shape. However in the depicted embodiment, the foil 120 is comprised of at least one helical surface 121 which is disposed about the central member 110. As such, at least a portion of the foil is always presented to the passing fluid, which allows for smoother force input to the central member, and accordingly, smoother power input. Additionally, the foil 120 may comprise a tapered configuration, as at 122, such that adjacently disposed foils 120 of adjacently disposed apparatuses 100 do not collide, as will be explained further below.

Figure 2:
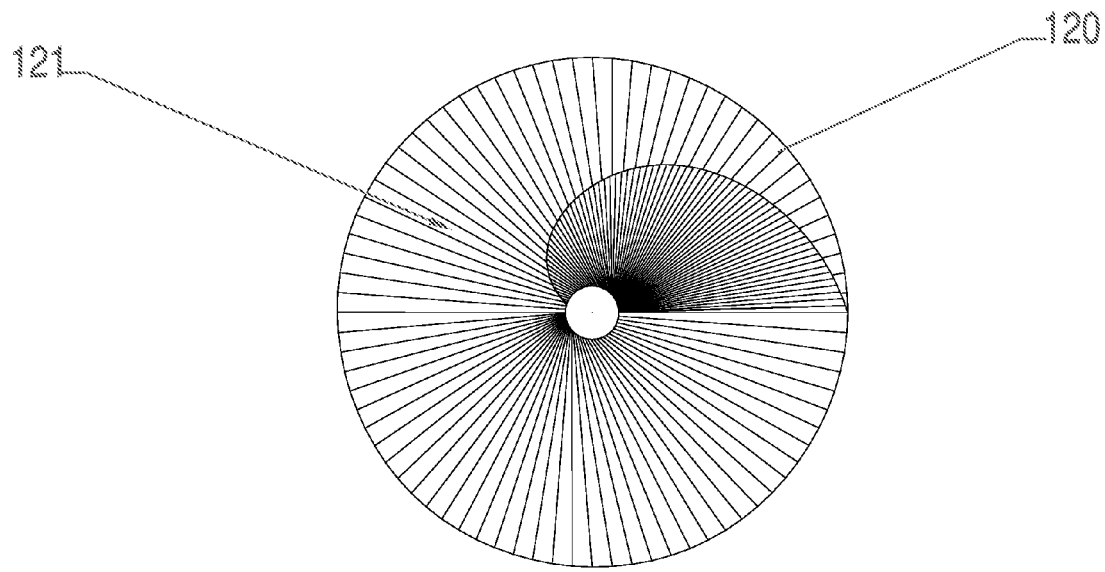
FIG. 2 is a top plan view of a foil in accordance with one embodiment of the present invention.

FIG. 2 provides a top plan view of a foil 120 in accordance with one embodiment of the present invention such that the general shape and configuration may be presented.

Figure 3:
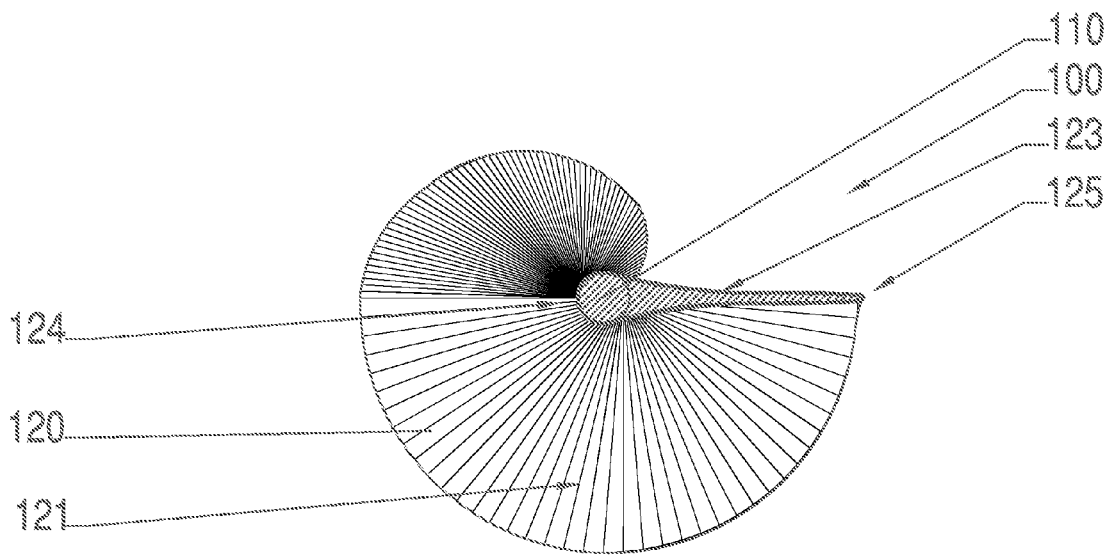
FIG. 3 is a section plan view taken along line 3-3 of FIG. 1 in accordance with one embodiment of the present invention.
Figure 4:
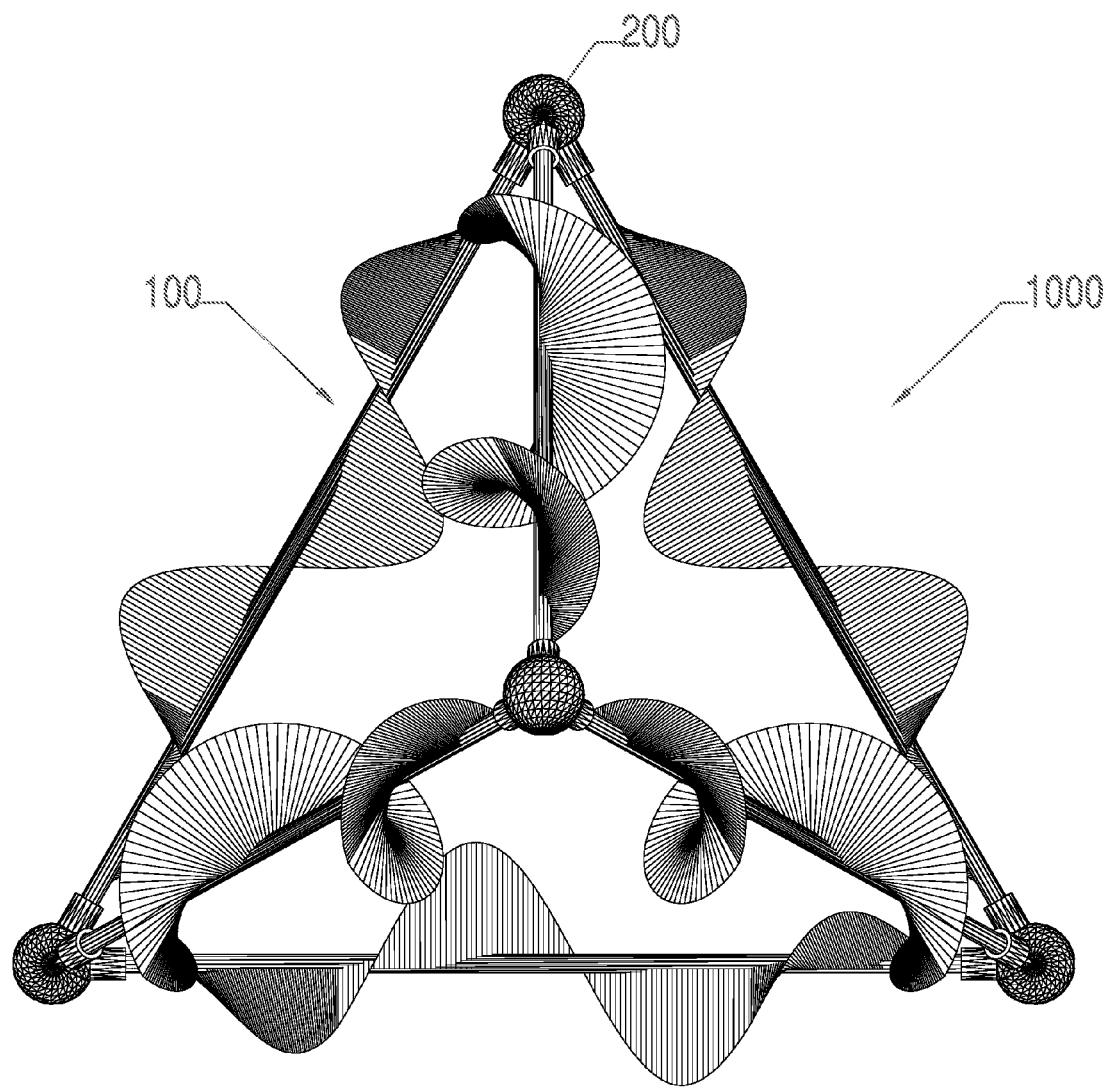
FIG. 4 is an assembly of apparatuses and connecting nodes in accordance with one embodiment of the present invention.

FIG. 3 presents a section plan view in accordance with one embodiment of the present invention along line 3-3 of FIG. 1, such that the general shape and configuration may be similarly presented. Accordingly, a cross-section of the foil 120 is presented. As can be seen, in the depicted embodiment, the cross-sectional area 123 of the foil 120 comprises a central portion 124 that substantially conforms to the central member 110 and gradually tapers toward a trailing edge 125 that is substantially thinner in cross section. It should be appreciated that the depicted embodiment is but one of many possible configurations encompassed by the present invention. One benefit of the depicted embodiment however, is that the enlarged central portion 124 of the foil 120 increases the bending moment resistance of the apparatus 100. Additionally, the depicted embodiment is capable of producing a low pressure lifting force on the leeward side of the foil 120, which supplements pressure on the windward side of the foil 120, thereby increasing the amount of torque produced by the apparatus 100 as it rotates.

As another feature of the present invention, a plurality of apparatuses 100 may be assembled into an assembly 1000 as exemplified in FIGS. 4 through 7. With continuing reference to FIGS. 1, and 4 through 7, the connecting nodes 200 may serve as junctions with which to interconnect the plurality of apparatuses 100. As such, one embodiment of a connecting node 200 may include a connecting node collar 210 into which an end 130, 140 of the central member 110 may be disposed. As can further be seen, the tapered configuration 122 of the foil 120, which in the depicted embodiment comprises a reduced radial dimension of the foil 120 at the first end 130 and second end 140, serves to provide clearance between adjacently disposed apparatuses 100 of the assembly 1000.

Figure 5:
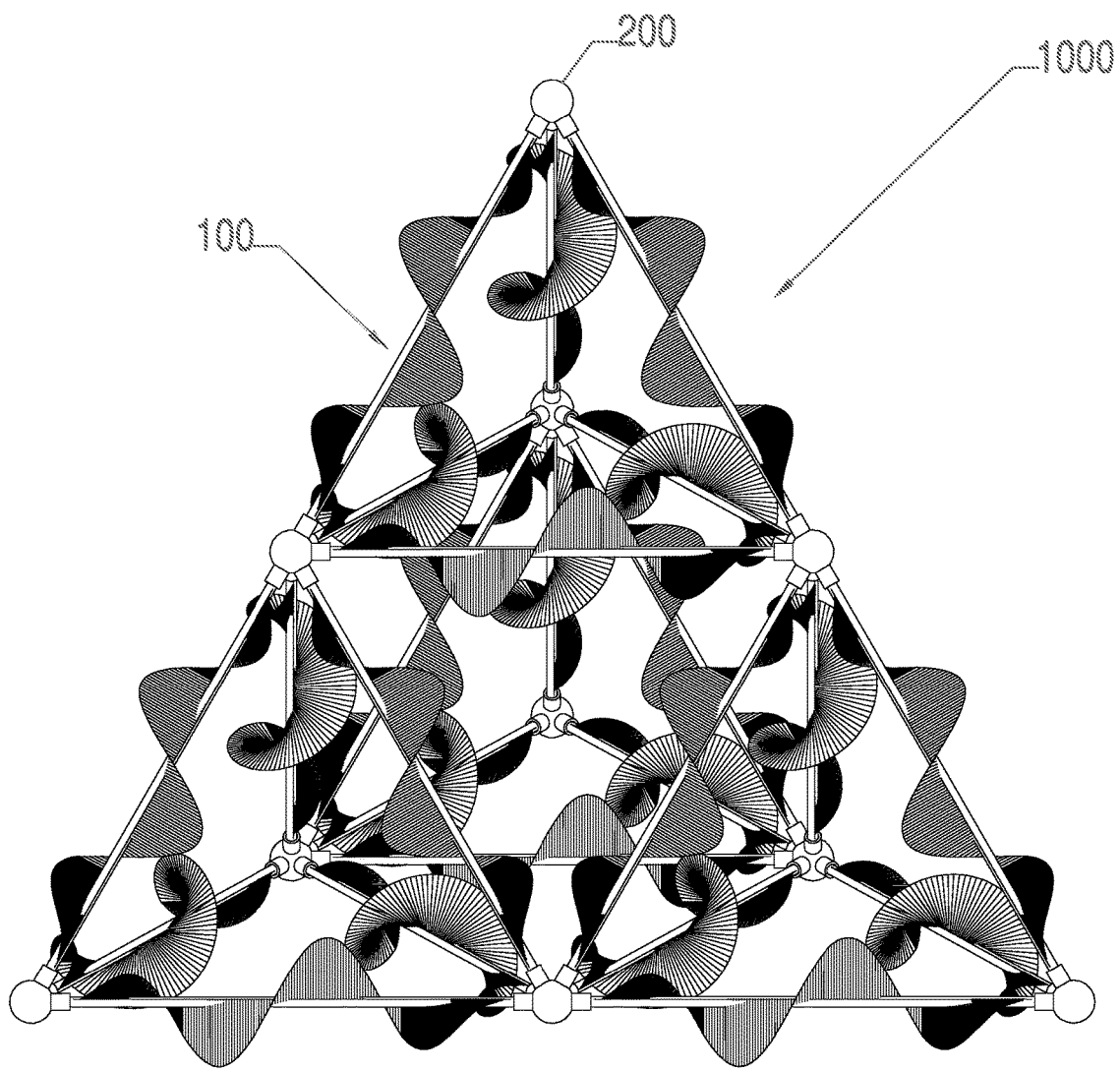
FIG. 5 is an assembly of apparatuses and connecting nodes in accordance with one embodiment of the present invention.
Figure 6:
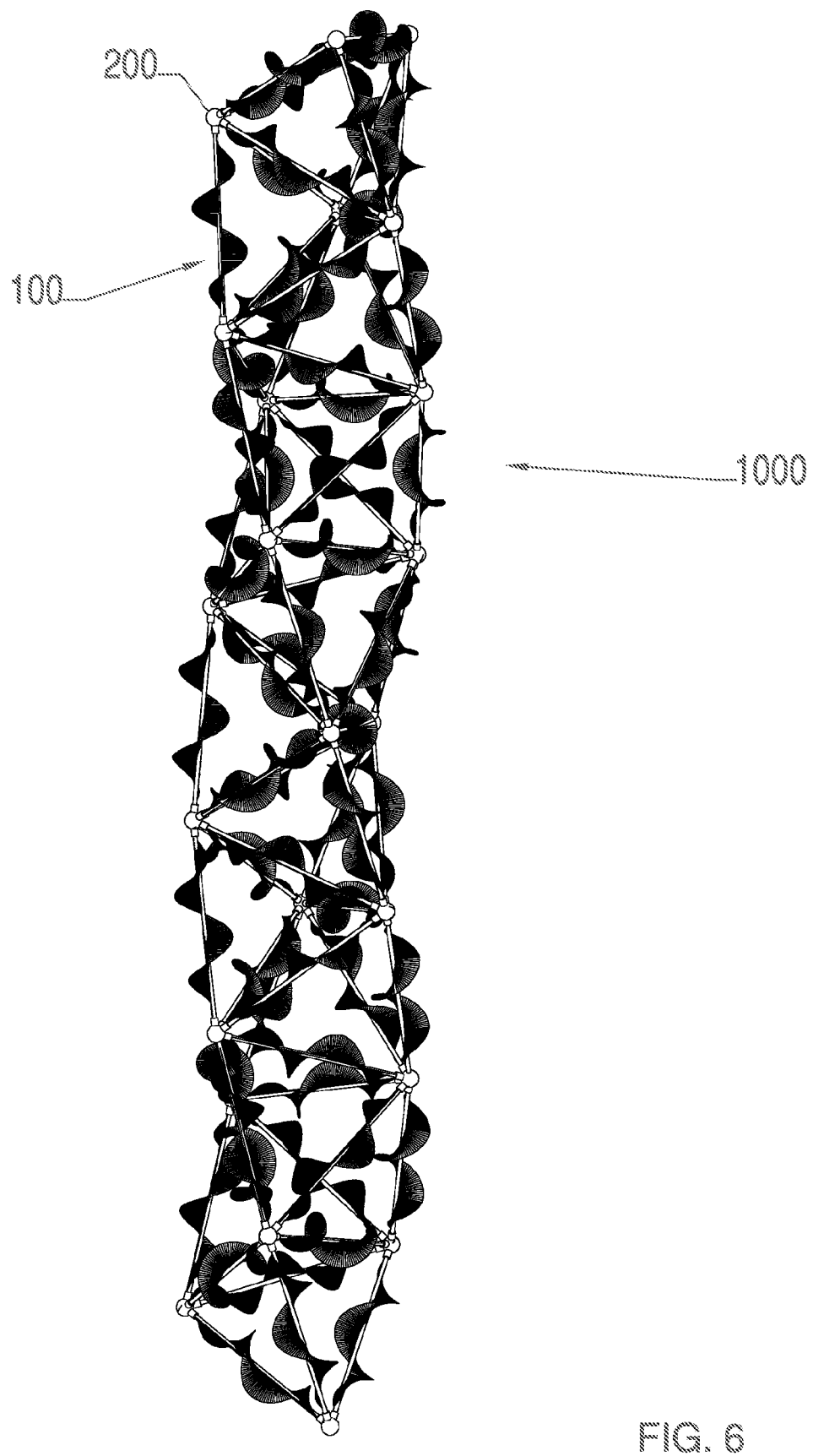
FIG. 6 is an assembly of apparatuses and connecting nodes in accordance with one embodiment of the present invention.
Figure 7:
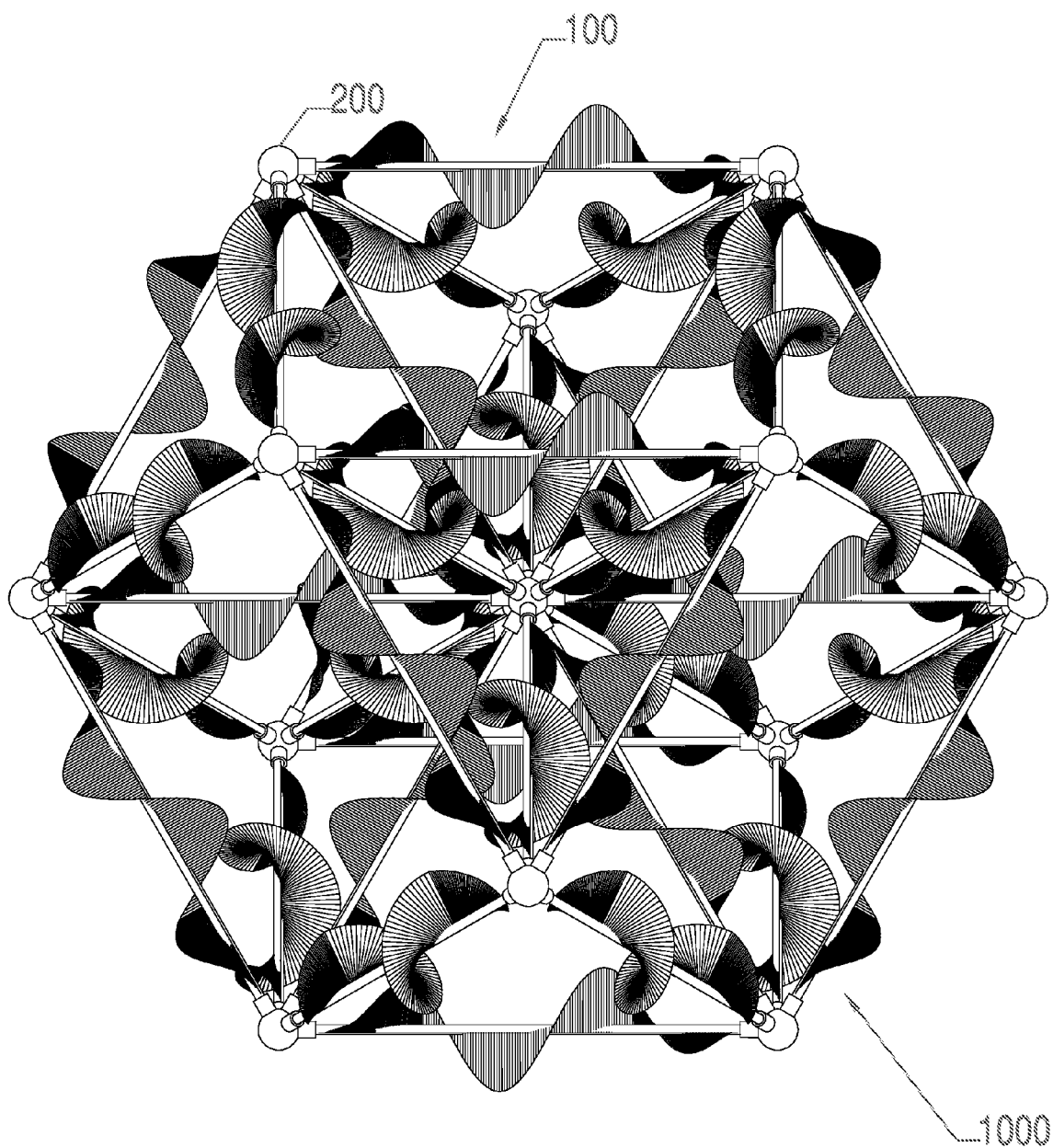
FIG. 7 is an assembly of apparatuses and connecting nodes in accordance with one embodiment of the present invention.

Additionally, the connecting nodes 200 may take any of a variety of desired configurations, as depicted in FIGS. 4-7, such configurations being mainly dictated by the shape of the desired assembly 1000, as depicted in FIGS. 5 and 7. In yet further embodiments, the connecting nodes 200 may be generally spherical, with varying numbers and configurations of collars 210, as desired.

Figure 8:
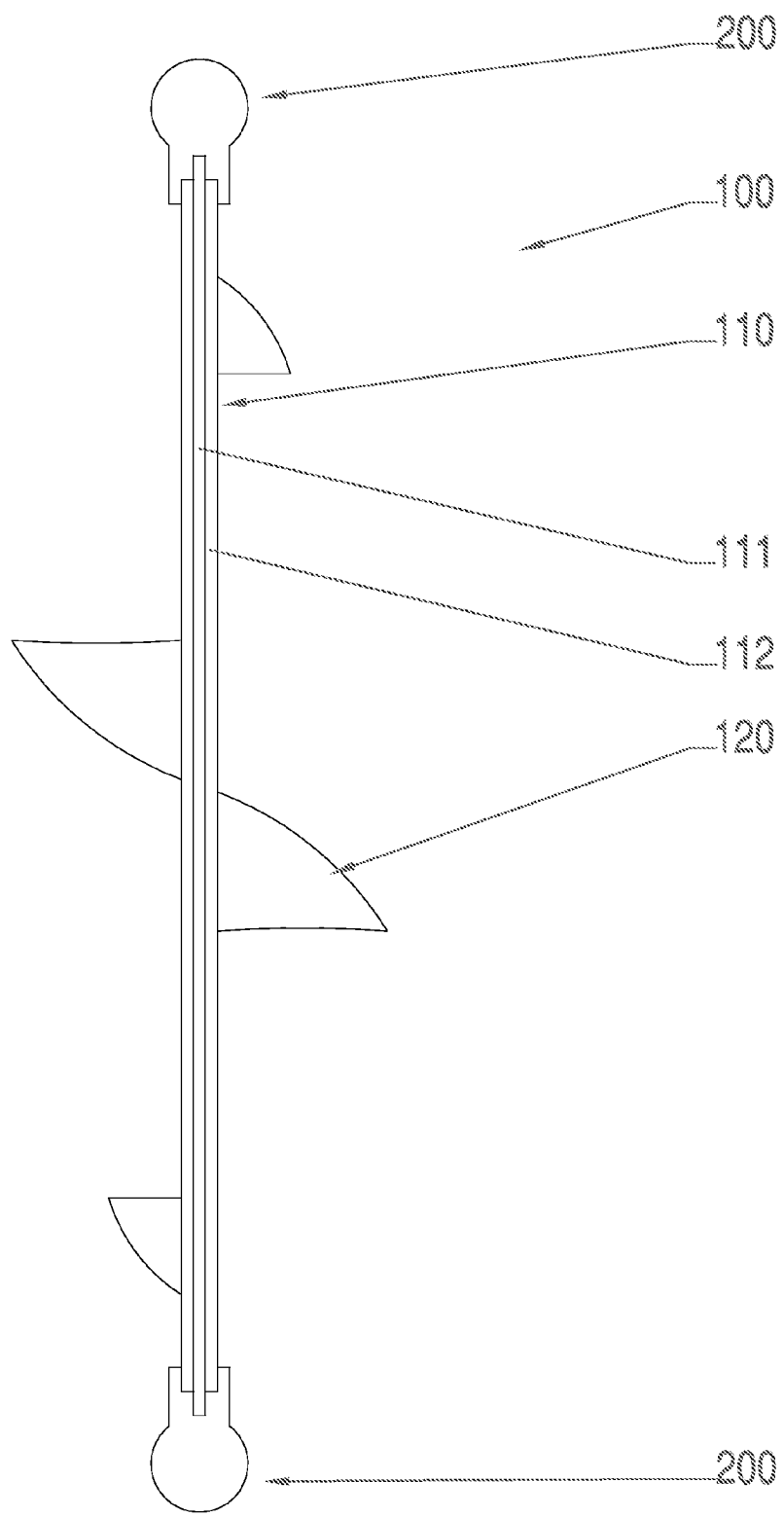
FIG. 8 is a side section view of one embodiment of an apparatus in accordance with the present invention.

Now turning to FIG. 8, depicted is one embodiment of an apparatus 100 according to the present invention that includes a stator 111 and a shell 112 within the central member 110. As such, at least a portion of the structure required for an electric generator may be disposed within the central member 110. Accordingly, the stator 111, even though stationary in the present invention, may correspond structurally to a rotor as generally implemented in electric motors or generators, as it is centrally located within the central member 110. Similarly, the shell 112, even though dynamic, may correspond structurally with a stator as generally implemented in electric motors or generators, as it is disposed about the stator 111 of the present invention. Thus, the stator 111 and shell 112 are comprised of such electrically and/or magnetically conductive material so as to form an electric generator or otherwise take advantage of the known effects of induction when the shell 112 is rotated about the stator 111 in order to produce electricity. It should be understood that the depicted structure merely depicts one embodiment of the present invention and many other embodiments are suitable. For example, any number of electrical generator structures may be disposed within the connecting node 200. For example, the central member 110 may be configured to rotate within at least a portion of the connecting node 200, thereby providing a rotor as commonly implemented in electric generators. Additionally, substantially all of the electrical generator structure may be disposed within the connecting node 200, and the central member 110 rigidly attached to the rotor therein, thereby driving the rotor when the central member 110 is rotated.

Furthermore, at least a portion of the central member 110 and connecting node 200 may be fabricated of electrically conductive material and include electrical contacts for electrical interconnection between adjacent central members 110 and connecting nodes 200. As such, when deployed as an assembly 1000 with a plurality of apparatuses 100, electricity may be drawn from and conducted through each apparatus 100 such that only one exterior electrical connection need be made in order to draw electricity from the assembly 1000. This may be accomplished, for example, by disposing a single electrical receptacle on a predetermined connecting node 200 of the assembly 1000, and constructing the assembly 1000 such that each successive apparatus 100 and connecting node 200 is disposed in electrical interconnection with the predetermined connecting node 200. Of course, in alternative embodiments, it may be desirable to utilize multiple electrical receptacles and/or other exterior electrical connections.

Figure 9:
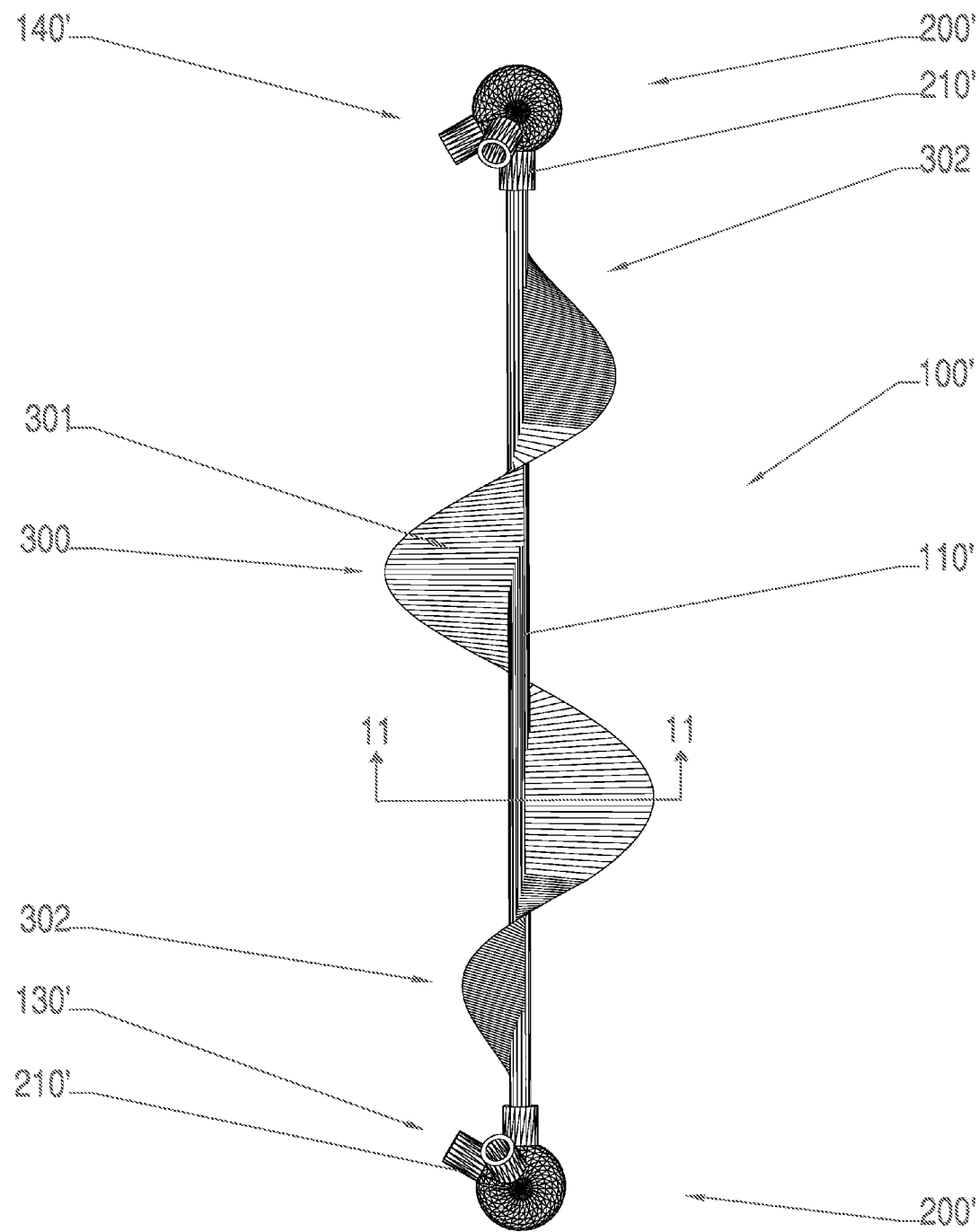
FIG. 9 is a side plan view of an electricity generating apparatus and connecting nodes according to one embodiment of the present invention.

FIG. 9 depicts another embodiment of the apparatus 100' of the present invention in which the foil, referred to as a solar foil 300, at least partially comprises an outer surface with photovoltaic properties 310. As can be seen, the solar foil 300 is substantially similar to the foil 120 of the previous embodiments in shape and configuration, including the solar foil 300 being disposed about the central member 110' in a helical plane 301 and, that the solar foil 300 may include a tapered configuration 302 so as to avoid interference with adjacently disposed apparatuses 100'. However the solar foil 300 includes a photovoltaic outer surface 310. Accordingly, the electricity-generating capability of the apparatus 100' of the present invention is enhanced beyond that of either a wind foil or a solar panel alone.

Figure 10:
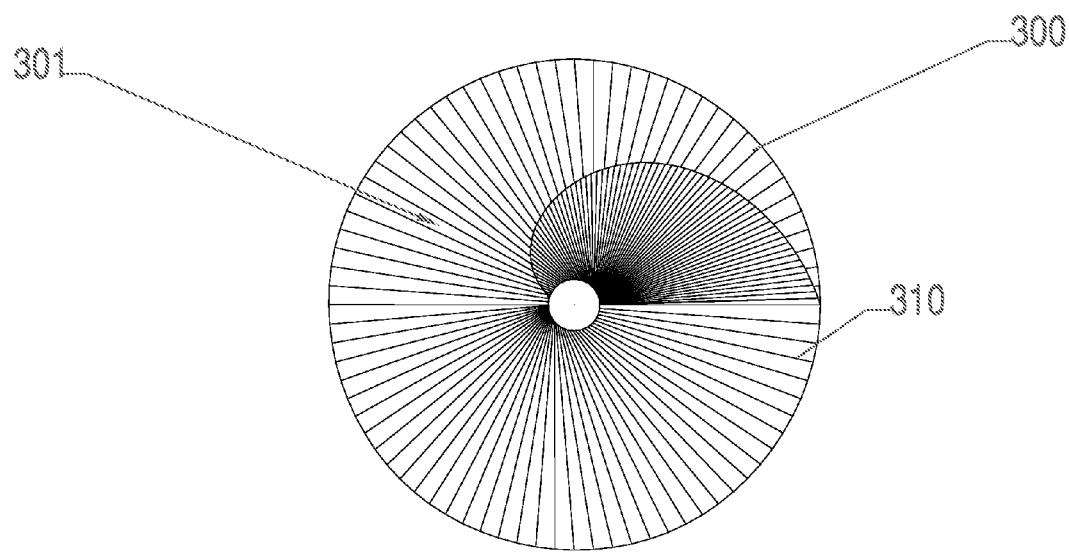
FIG. 10 is a top plan view of a foil in accordance with one embodiment of the present invention

FIG. 10 depicts a top plan view of a solar foil 300 in accordance with one embodiment of the present invention such that the general shape and configuration may be presented.

Figure 11:
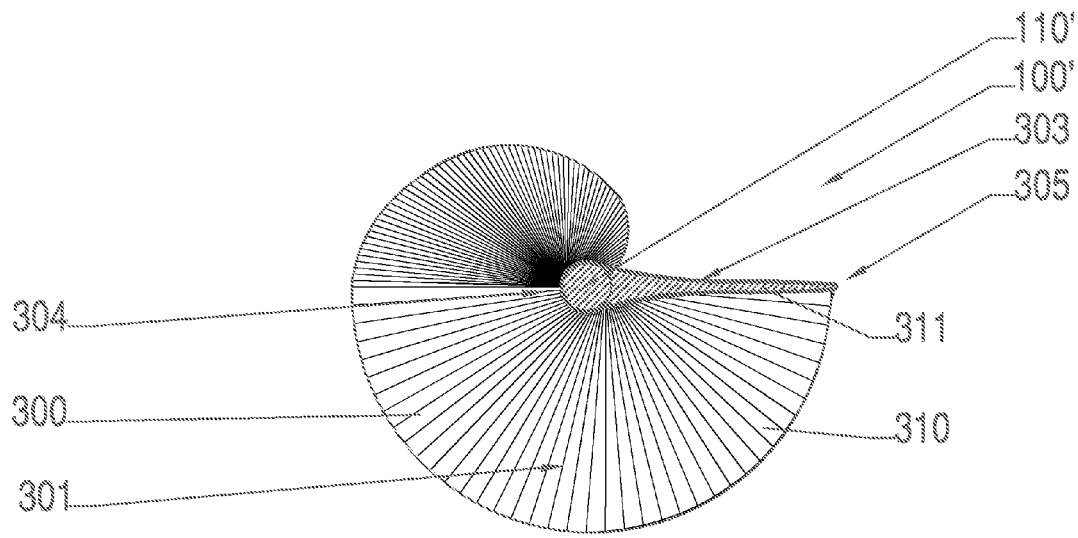
FIG. 11 is a section plan view taken along line 11-11 of FIG. 9 in accordance with one embodiment of the present invention.

FIG. 11 is a section plan view taken along line 11-11 of FIG. 9, such that the general shape and configuration may be similarly presented. Accordingly, a cross-section of the solar foil 300 is presented. As can be seen, in the depicted embodiment, the cross-sectional area 303 of the solar foil 300 comprises a central portion 304 that substantially conforms to the central member 110' and gradually tapers toward a trailing edge 305 that is substantially thinner in cross-section, similar to the previous embodiment discussed herein. However, the solar foil 300 of the present embodiment also includes a photovoltaic outer surface 310, which, in certain embodiments, may at least partially be comprised of a thin-film photovoltaic cell 311 applied to the helical plane 301, or in yet further embodiments, at least partially comprising the helical plane 301.

Figure 12:
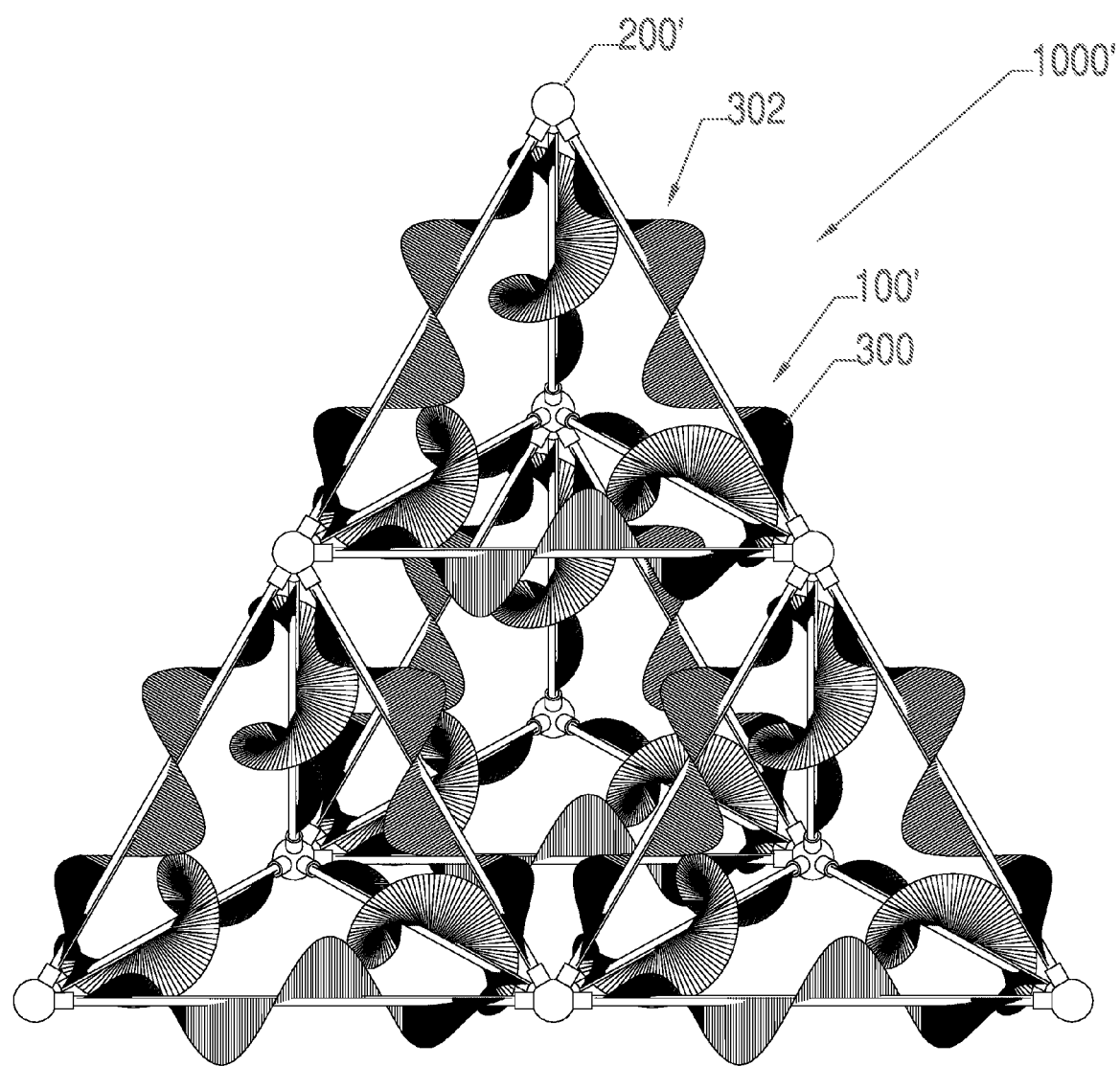
FIG. 12 is an assembly of apparatuses and connecting nodes in accordance with one embodiment of the present invention.

FIG. 12 depicts a plurality of apparatuses 100', each utilizing a solar foil 300 of the present embodiment, assembled into an assembly 1000' as in previous embodiments. As can further be seen, the tapered configuration 302, which in the depicted embodiment comprises a reduced radial dimension of the solar foil 300, serves to provide clearance between immediately adjacent apparatuses.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

Now that the invention has been described,

What is claimed is:

1. A modular electricity generating apparatus comprising:
an elongate, central member;
at least one solar foil disposed about said central member in rotational relation thereto;
said at least one solar foil at least partially comprising a photovoltaic outer surface;
said central member further including at least a first end and a second end;
each of said first end and said second end dimensioned and configured to be connected to a connecting node, respectively;
said elongate central member further including an electrically conductive material;
said elongate central member further configured to dispose one of the connecting nodes into electrical communication with the other of the connecting nodes.

2. The apparatus as recited in claim 1 wherein said central member further comprises a stator member rigidly connected to the connecting nodes.

3. The apparatus as recited in claim 2 wherein said central member further comprises a shell rotationally disposed about said stator member.

4. The apparatus as recited in claim 3 wherein said stator and said shell at least partially comprise an electrical generator.

5. The apparatus as recited in claim 3 wherein said at least one solar foil is rigidly connected to said shell.

6. The apparatus as recited in claim 3 wherein said at least one solar foil is formed unitarily with said shell.

7. The apparatus as recited in claim 1 wherein said at least one solar foil includes at least one surface disposed helically about said central member.

8. The apparatus as recited in claim 7 wherein said at least one solar foil further comprises a reduced radius toward each of said first end and said second end, providing clearance for adjacently disposed foils of others of said apparatus.

9. The apparatus as recited in claim 7 wherein said at least one solar foil further includes a central portion substantially conforming to said central member.

10. The apparatus as recited in claim 9 wherein said at least one solar foil further includes a trailing edge that is thinner in cross-section than said central portion.

11. An electricity generating assembly comprising:
a plurality of electricity generating apparatuses, each including at least an elongate central member, a first end, a second end, and at least one solar foil disposed about said central member, said at least one solar foil including a photovoltaic outer surface;
a plurality of connecting nodes;
each connecting node of said plurality of connecting nodes including at least one connecting node collar projecting therefrom;
each of said first ends and second ends rotationally disposed within a corresponding one of said connecting node collars of said plurality of connecting nodes, thereby interconnecting said plurality of apparatuses;
each apparatus of said plurality of apparatuses and each connecting node of said plurality of connecting nodes correspondingly configured and disposed to conduct electricity from at least one of said plurality of connecting nodes to any other of said plurality of connecting nodes.

12. The electricity generating assembly as recited in claim 11 wherein at least some of said plurality of central members further comprise a stator member and a shell, said stator member rigidly connected to said connecting nodes, respectively; said shell rotationally disposed about said stator member, respectively; and, wherein said stator member and said shell, respectively, at least partially comprise an electrical generator.

13. The electricity generating assembly as recited in claim 11 wherein at least some of said connecting nodes include a connecting node collar; at least some of said first ends and said second ends are disposed within corresponding ones of said connecting node collars, respectively.

14. The electricity generating assembly as recited in claim 13 wherein at least a portion of either of said first end or said second end of said central member is rotationally disposed within said collar, respectively.

15. The electricity generating assembly as recited in claim 14 wherein said collar and said either of said first end or said second end of said central member, respectively, at least partially comprise an electrical generator.

16. The electricity generating assembly as recited in claim 11 wherein at least some of said connecting nodes further comprise at least one electrical generator connected in mechanically driven relation to either of said first end or said second end of said central member, respectively.

17. A rotatable solar foil apparatus comprising:
an elongate, central member;
at least one solar foil disposed about said central member in fluid interacting relation thereto;
said at least one solar foil at least partially comprising a thin-film photovoltaic cell configured in a helical plane thereof;
said central member further including at least a first end and a second end;
each of said first end and said second end dimensioned and configured to be connected to a connecting node, respectively;
said elongate central member further including an electrically conductive material;
said elongate central member further configured to conduct electricity from at least said at least one solar foil to at least one of said connecting nodes; and
both of said connecting nodes disposed in electrical communication with said at least one solar foil.

18. The rotatable solar foil apparatus as described in claim 17 wherein said central member comprises at least a stator and a shell, said shell being rotationally disposed about said stator, said at least one solar foil being disposed helically about said shell.

19. The rotatable solar foil apparatus as described in claim 17 wherein said electrical communication of both of said connecting nodes with said at least one solar foil is at least partially accomplished via said electrically conductive material of said central member.

* * * * *